(12) United States Patent
Matsumoto et al.

(10) Patent No.: US 9,842,779 B2
(45) Date of Patent: Dec. 12, 2017

(54) METHOD OF EVALUATING METAL CONTAMINATION IN SEMICONDUCTOR WAFER AND METHOD OF MANUFACTURING SEMICONDUCTOR WAFER

(71) Applicant: SUMCO CORPORATION, Tokyo (JP)

(72) Inventors: Kei Matsumoto, Hiroshima (JP); Kazutaka Eriguchi, Saga (JP); Noritomo Mitsugi, Saga (JP); Tsuyoshi Kubota, Saga (JP)

(73) Assignee: SUMCO CORPORATION, Tokyo (JP)

( * ) Notice: Subject to any disclaimer, the term of this patent is extended or adjusted under 35 U.S.C. 154(b) by 340 days.

(21) Appl. No.: 14/647,963

(22) PCT Filed: Jan. 24, 2014

(86) PCT No.: PCT/JP2014/051470
§ 371 (c)(1),
(2) Date: May 28, 2015

(87) PCT Pub. No.: WO2014/115829
PCT Pub. Date: Jul. 31, 2014

(65) Prior Publication Data
US 2015/0318222 A1 Nov. 5, 2015

(30) Foreign Application Priority Data
Jan. 24, 2013 (JP) .................. 2013-011446

(51) Int. Cl.
*G06F 11/00* (2006.01)
*H01L 21/66* (2006.01)

(52) U.S. Cl.
CPC .............. *H01L 22/14* (2013.01); *H01L 22/12* (2013.01); *H01L 22/20* (2013.01)

(58) Field of Classification Search
CPC ........................... A24F 47/008; H05B 1/0244
(Continued)

(56) References Cited

U.S. PATENT DOCUMENTS

2012/0259449 A1 10/2012 Favre et al.
2014/0097866 A1 4/2014 Matsumoto et al.

FOREIGN PATENT DOCUMENTS

DE 10048809 A1 4/2002
JP 60-48683 B2 10/1985
(Continued)

OTHER PUBLICATIONS

Schroder, D K et al.: Review Article: "Surface voltage and surface photovoltage: history, theory and applications" Measurement Science and Technology, vol. 12, No. 3, Mar. 1, 2001, R16-R31.
(Continued)

*Primary Examiner* — Edward Raymond
(74) *Attorney, Agent, or Firm* — Greenblum & Bernstein, P.L.C.

(57) ABSTRACT

An aspect of the present invention relates to a method of evaluating metal contamination in a semiconductor wafer that has been subjected to a heat treatment, which comprises obtaining analysis values by analyzing a plurality of analysis points on a surface of the semiconductor wafer by a first analysis method or a second analysis method, wherein in the first analysis method, analysis values employed in evaluation decrease as an amount of contamination by a metal element that is to be evaluated increases, and in the second analysis method, analysis values employed in evaluation increase as an amount of contamination by a metal element that is to be evaluated increases, and wherein determination of presence or absence of localized contamination by the metal element that is to be evaluated is made by evaluating
(Continued)

the analysis values based on the normal value specified by a probability distribution function.

8 Claims, 3 Drawing Sheets

(58) Field of Classification Search
USPC .................................................. 702/182–185
See application file for complete search history.

(56) References Cited

FOREIGN PATENT DOCUMENTS

| | | |
|---|---|---|
| JP | 2005-19445 | 1/2005 |
| JP | 2009-302337 | 12/2009 |
| JP | 2010-177238 | 8/2010 |
| JP | 2010-177241 | 8/2010 |
| JP | 2011-238626 | 11/2011 |
| JP | 2011-238656 | 11/2011 |
| KR | 10-2005-0106486 | 11/2005 |
| TW | 201138005 | 11/2011 |

OTHER PUBLICATIONS

Polignano M L et al.: "Quantitative evaluation of bulk-diffused metal contamination by lifetime techniques" Materials Science and Engineering B55 (1998) 21-33.
Extended European Search Report in counterpart EP Application No. 14743430.2, dated Aug. 8, 2016.
Notice of Allowance issued in Taiwan Patent Application No. 103102700, dated Jan. 30, 2016.
Office Action in Chinese Application No. 201480005010.2, dated Sep. 30, 2016, with partial English language translation.
Notice of Allowance issued in Korean Patent Application No. 10-2015-7012986, dated Feb. 29, 2016.
International Search Report from PCT/JP2014/051470 with English language translation, dated Feb. 18, 2014.
International Preliminary Report on Patentability for PCT/JP2014/051470, English and Japanese versions, dated Jul. 28, 2015.

Fig. 1
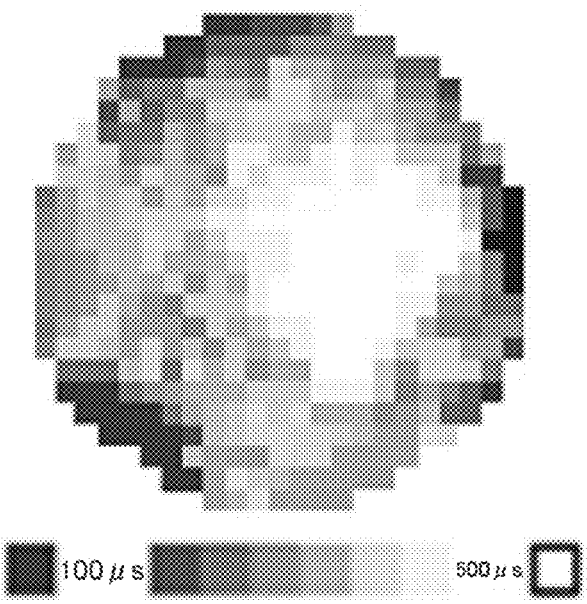
(a) High contamination level wafer
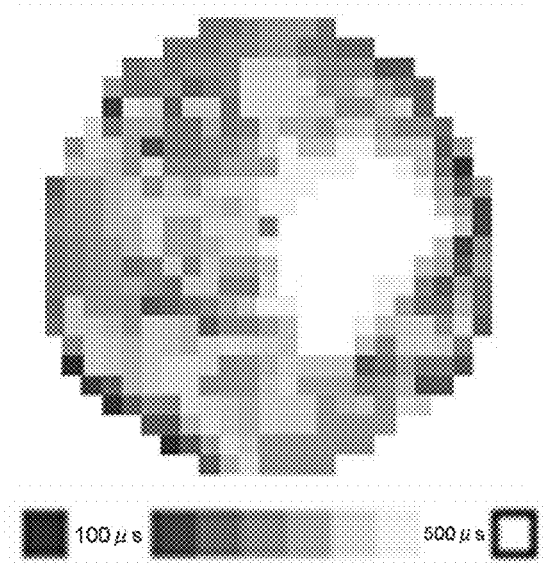
(a) Low contamination level wafer

METHOD OF EVALUATING METAL CONTAMINATION IN SEMICONDUCTOR WAFER AND METHOD OF MANUFACTURING SEMICONDUCTOR WAFER

CROSS-REFERENCE TO RELATED APPLICATIONS

This application claims the benefit of priority to Japanese Patent Application No. 2013-011446 filed on Jan. 24, 2013, which is expressly incorporated herein by reference in its entirety.

TECHNICAL FIELD

The present invention relates to a method of evaluating metal contamination in a semiconductor wafer, and more particularly, to a method of evaluating metal contamination in a semiconductor wafer permitting evaluation of the presence or absence of localized metal contamination.

The present invention further relates to a method of manufacturing a semiconductor wafer that provides a product wafer that has been quality controlled based on evaluation by the above method.

BACKGROUND ART

The metal contamination of semiconductor wafers negatively affects the device characteristics of products. Examples of steps that cause metal contamination are various heat treatments in the process of manufacturing wafers, such as oxidation, diffusion, and epitaxial growth. For example, when a heavy metal such as Fe or Ni is contaminated into a silicon wafer by a heat treatment, a deep level is created in the band gap, functioning as a carrier trapping center or recombination center and causing p-n junction leaks in the device and decreasing its lifetime. Accordingly, providing a high-quality semiconductor wafer with little metal contamination requires a highly reliable method of evaluating the metal contamination in a semiconductor wafer following a heat treatment.

In this regard, Japanese Unexamined Patent Publication (KOKAI) No. 2009-302337, which is expressly incorporated herein by reference in its entirety, proposes managing the heat treatment processes in the process of manufacturing a semiconductor wafer by using a monitor wafer for monitoring contamination in heat treatment processes.

The metal contamination that is caused by heat treatment processes is roughly divided into contamination caused by metal impurities that contaminate from the heat treatment atmosphere and contamination in the form of diffusion in the vicinity of contact portions during heat treatment by metal impurities that adhere to the semiconductor wafer due to contact with a contamination source (such as particles containing metal components; wafer holders such as heat treatment boats, susceptors, and three-point support pins; and various metal manufacturing jigs) prior to and during heat treatment processes. The latter form of metal contamination occurs in localized fashion in the vicinity of contact portions.

Japanese Unexamined Patent Publication (KOKAI) No. 2009-302337 determines the presence or absence of metal contamination from the heat treatment atmosphere based on the level of a lifetime measurement value. However, it is difficult to evaluate the latter localized metal contamination by this method.

SUMMARY OF THE INVENTION

An aspect of the present invention provides for a means of evaluating the presence or absence of localized metal contamination in a semiconductor wafer following a heat treatment.

The method based on lifetime measurement described in Japanese Unexamined Patent Publication (KOKAI) No. 2009-302337 is one means of evaluating metal contamination in semiconductor wafers. An additional known method is based on the measurement of diffusion length. Thus, determining the presence or absence of localized contamination based on the level of the value measured for diffusion or the lifetime in a region of a semiconductor wafer being evaluated that is expected of having been locally contaminated (also referred to as a "region expected of contamination", hereinafter) are conceivable.

However, internal oxygen precipitates (BMDs: Bulk Micro Defects) and minute defects that become growth nuclei have come to be present in high concentrations due to strengthening of the intrinsic gettering function in many of the wafers that have been used as semiconductor substrates in recent years. Although the metal contamination of semiconductor wafers decreases the values measured for the diffusion length and the lifetime, the above BMDs and minute defects also decrease the values measured for the diffusion length and lifetime. Accordingly, by focusing on just the magnitude of the values measured for the diffusion length and lifetime in a region expected of contamination regardless of the size and density of minute defects and BMDs in semiconductor wafers presents the risk of making an incorrect determination of presence of localized metal contamination in wafers in which the measured values have decreased due to factors other than metal contamination. This applies not just to analysis methods in which the measurement values decrease as the quantity of metal contamination increases, but also to analysis methods where the analysis value increases with the amount of metal contamination, such as analysis of metal contamination concentration based on calculation with the diffusion length. That is, it is difficult to evaluate with high reliability the presence or absence of localized metal contamination in a semiconductor wafer being evaluated using an analysis value that is affected by factors other than metal contamination.

It is also conceivable to conduct semiconductor wafer lifetime or diffusion length mapping measurement, visually observe the map obtained, and evaluate the presence or absence of localized metal contamination based on whether or not low lifetime regions or low diffusion length regions are present. However, this method does not permit quantitative evaluation.

In contrast, the present inventors conducted extensive research resulting in the discovery that by detecting the presence or absence of a localized and extremely abnormal value among multiple analysis values, it was possible to determine the presence or absence of localized metal contamination. The present invention was devised on that basis.

An aspect of the present invention relates to a method of evaluating metal contamination in a semiconductor wafer that has been subjected to a heat treatment, which comprises:

obtaining analysis values by analyzing a plurality of analysis points on a surface of the semiconductor wafer by a first analysis method or a second analysis method, wherein in the first analysis method, analysis values employed in evaluation decrease as an amount of contamination by a metal element that is to be evaluated increases, and in the second analysis method, analysis values employed in evaluation increase as an amount of contamination by a metal element that is to be evaluated increases; and among the plurality of analysis points, estimating a number P of analysis points to which a contaminant metal element that is to be evaluated and that has adhered to the semiconductor wafer due to contact with a contamination source is expected to diffuse due to the heat treatment; and wherein when the analysis values are obtained by the first analysis method, the analysis values of all of the analysis points are arranged in ascending order, and an analysis value Vp at a Pth point counting over from a minimal value is a value that is lower than or equal to a lower limit of a normal value specified by a probability distribution function, determination of presence of localized contamination by the metal element that is to be evaluated is made, and when the value exceeds the lower limit, determination of absence of localized contamination by the metal element that is to be evaluated is made; and when the analysis values are obtained by the second analysis method, the analysis values of all of the analysis points are arranged in ascending order, and an analysis value Vp of a Pth point counting over from a maximum value is a value that is greater than or equal to an upper limit of a normal value specified by a probability distribution function, determination of presence of localized contamination by the metal element that is to be evaluated is made, and when the value is lower than the upper limit, determination of absence of localized contamination by the metal element that is to be evaluated is made.

In an embodiment, the probability distribution function is a normal distribution, the lower limit of the normal value specified by the probability distribution function in the case where the analysis values are obtained by the first analysis method is:

$$Avg.-Y*\sigma$$

wherein Avg. denotes an average value of the analysis values at all of the analysis points, $\sigma$ denotes a standard deviation, and Y is a number ranging from 2 to 3, and the upper limit of the normal value specified by the probability distribution function in the case where the analysis values are obtained by the second analysis method is:

$$Avg.+Y*\sigma$$

wherein Avg. denotes an average value of the analysis values at all of the analysis points, $\sigma$ denotes a standard deviation, and Y is a number ranging from 2 to 3.

In an embodiment, the total number of the analysis points is denoted as $P_{all}$, the value of Y is determined based on a cumulative frequency X % as calculated by:

$$X=(P/P_{all})*100$$

In an embodiment, the analysis method that is used to obtain the analysis values is a µ-PCD method or an SPV method.

A further aspect of the present invention relates to a method of manufacturing a semiconductor wafer, which comprises:

preparing a wafer lot comprising a plurality of semiconductor wafers by a manufacturing process comprising a heat treatment;

extracting at least one semiconductor wafer as an evaluation wafer from among the wafer lot;

evaluating the evaluation wafer that has been extracted by the method of evaluating metal contamination set forth above; and shipping as a product wafer the semiconductor wafer comprised in the same lot as an evaluation wafer that has been determined as absence of localized metal contamination by the evaluation.

The present invention permits evaluation of the presence or absence of localized contamination of semiconductor wafers following a heat treatment that is due to contact with a contamination source prior to and during the heat treatment process. Further, it permits the shipping of product wafers in the form of high-quality semiconductor wafers with little or no localized metal contamination by means of quality control based on evaluation results.

BRIEF DESCRIPTION OF DRAWINGS

FIG. 1 The lifetime map of a wafer belonging to a highly contaminated group that was measured in Example 1 is shown in (a) and the lifetime map of a wafer belonging to a low contamination group is shown in (b).

MODES FOR CARRYING OUT THE INVENTION

Figure 2:
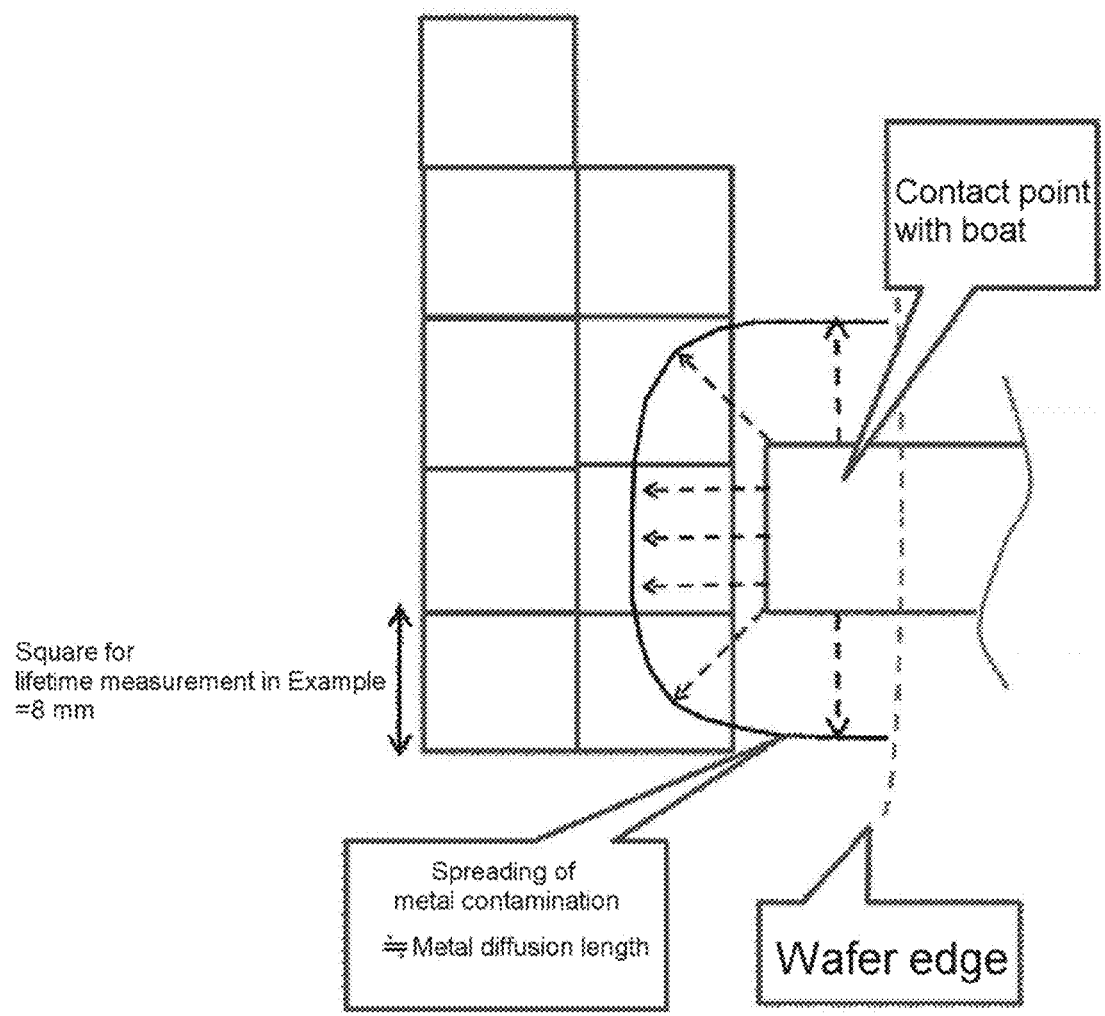
FIG. 2 A drawing descriptive of an example of how to obtain number P, described further below.

An aspect of the present invention is a method of evaluating metal contamination in a semiconductor wafer that has been subjected to a heat treatment, which comprises:

obtaining analysis values by analyzing a plurality of analysis points on a surface of the semiconductor wafer by a first analysis method or a second analysis method, wherein in the first analysis method, analysis values employed in evaluation decrease as an amount of contamination by a metal element that is to be evaluated increases, and in the second analysis method, analysis values employed in evaluation increase as an amount of contamination by a metal element that is to be evaluated increases; and among the plurality of analysis points, estimating a number P of analysis points to which a contaminant metal element that is to be evaluated and that has adhered to the semiconductor wafer due to contact with a contamination source is expected to diffuse due to the heat treatment; and wherein when the analysis values are obtained by the first analysis method, the analysis values of all of the analysis points are arranged in ascending order, and an analysis value Vp at a Pth point counting over from a minimal value is a value that is lower than or equal to a lower limit of a normal value specified by a probability distribution function, determination of presence of localized contamination by the metal element that is to be evaluated is made, and when the value exceeds the lower limit, determination of absence of localized contamination by the metal element that is to be evaluated is made; and when the analysis values are obtained by the second analysis method, the analysis values of all of the analysis points are arranged in ascending order, and an analysis value Vp of a Pth point counting over from a maximum value is a value that is greater than or equal to an upper limit of a normal value specified by a probability distribution function, determination of presence of localized contamination by the metal element that is to be evaluated is made, and when the value is lower than the upper limit, determination of absence of localized contamination by the metal element that is to be evaluated is made.

In the method of evaluating metal contamination according to an aspect of the present invention, a semiconductor wafer that is to be evaluated is analyzed to obtain analysis values by the first method in which analysis values employed in evaluation decrease as an amount of contamination by a metal element that is to be evaluated increases, or by the second analysis method in which analysis values employed in evaluation increase as an amount of contamination by a metal element that is to be evaluated increases Examples of the analysis value obtained by the first analysis method are the recombination lifetime (also referred to as simply the "lifetime") as measured by the microwave photoconductivity decay method (μ-PCD method) and the minority carrier diffusion length (also referred to as simply the "diffusion length") as measured by the surface photo-voltage method (SPV method).

On the other hand, a metal impurity concentration (the concentration of Fe, for example) calculated from the diffusion length measured by the SPV method is an example of an analysis value obtained by the second analysis method.

It is difficult to evaluate the presence or absence of localized contamination with high reliability by methods of evaluating the presence or absence of metal contaminants based on just analysis values obtained by analysis, as set forth above, because these analysis values are affected by factors other than metal contamination. Accordingly, the present invention determines the presence or absence of localized metal contamination based on whether or not localized and extremely abnormal values are contained among a plurality of analysis values. On that basis, the effects of BMDs, minute defects, and the like that are contained in a semiconductor wafer can be reduced or eliminated, permitting evaluation of the presence or absence of localized metal contamination with greater precision. A detailed description will be given below.

For conducting evaluation, analysis values are first obtained by the first analysis method or the second analysis method at a plurality of points on the surface of the semiconductor wafer that is to be evaluated. As the analysis method, the analysis method with various devices that are capable of conducting an in-plane multiple point measurement and evaluating the in-plane distribution of metal contamination can be employed. Specific examples, as stated above, are the μ-PCD method and the SPV method. Measurement and analysis can be conducted by known methods using commercial devices. In the method of evaluating metal contamination of the present invention, the following steps are conducted to determine whether or not localized and extremely abnormal values are contained among the analysis values that have been obtained.

First, the number P of the analysis points at which diffusion of the contaminant metal element that is to be evaluated and that has adhered to the semiconductor wafer due to contact with a contamination source is expected to occur due to the heat treatment is estimated among the plurality of analysis points at which analysis is conducted. P can be estimated based on the diffusion length during heat treatment as an analysis value to be estimated. The amounts of diffusion of various metals due to heat treatments are known values in the literature. For example, a heat treatment for 90 minutes at 1,000° C. produces a Ni diffusion length of 7.6 mm and an Fe diffusion length of about 4 mm. Based on the diffusion length, wafer size, size of the analysis point, contact position of the contamination source, and the like, it is possible to expect whether the metal diffusion will reach certain portions of the analysis points. Specific examples of estimation methods are given in Examples, further below.

Next, when the analysis values are obtained by the first analysis method, the analysis values of all of the analysis points are arranged in ascending order, and the analysis value Vp at the Pth point counting over from the minimal value is a value that is lower than or equal to the lower limit of the normal value specified by a probability distribution function, determination of the presence of localized contamination by the metal element that is to be evaluated is made, and when the value exceeds the lower limit, determination of the absence of localized contamination by the metal element that is to be evaluated is made. In this manner, in the present invention, it is possible to evaluate analysis values based on a normal value specified by a probability distribution function, thereby permitting the detection of localized and extremely abnormal values, and on that basis, the evaluation of the presence or absence of localized metal contamination.

On the other hand, when the analysis values are obtained by the second analysis method, the analysis values of all of the analysis points are arranged in ascending order, and the analysis value Vp at the Pth point counting over from the maximum value is a value greater than or equal to the upper limit of the normal value specified by a probability distribution function, determination of the presence of localized contamination by the metal element that is to be evaluated is made, and when the value is lower than the upper limit, determination of the absence of localized contamination by the metal element that is to be evaluated is made. In this manner, when using the second analysis method, in the same manner as when using the first analysis method, analysis values are evaluated based on a normal value specified by a probability distribution function.

Thus, based on the method of evaluating metal contamination according to an aspect of the present invention, it is possible to evaluate the presence or absence of localized metal contamination in a semiconductor wafer following a heat treatment.

A normal distribution, Weibull distribution, or the like can be used as the above probability distribution function. When employing a normal distribution as the probability distribution function, the lower limit of the normal value that is the threshold value when employing the first analysis method can be calculated as:

$$\text{Avg.} - Y^*\sigma$$

On the other hand, the upper limit of the normal value that is the threshold value when employing the second analysis method can be calculated as:

$$\text{Avg.} + Y^*\sigma$$

In this context, Avg. is the average value of the analysis values of all of the analysis points, $\sigma$ is the standard deviation thereof, and Y is a number ranging from 2 to 3.

For example, when the total number of analysis points is denoted as $P_{all}$ and the cumulative frequency X (%) is calculated as:

$$X = (P/P_{all})^*100$$

from $P_{all}$ and the number P of analysis points expected to be reached by diffusion of the contaminant metal element that is to be evaluated as estimated in advance, Y can be determined based on cumulative frequency X, for example, in the following manner.

As is known, in a single group exhibiting a normal distribution, when the probability of a value of less than or equal to:

$$\text{Avg.} - Y^*\sigma$$

is denoted as f(Y) %, one obtains f(Y)=f(2)=2.5 when Y=2 and f(Y)=f(c)=0.15 when Y=3.

For example, when the analysis values are obtained by the first analysis method, the analysis value V at the Pth point corresponding to cumulative frequency X % is less than or equal to:

$$Avg.-Y*\sigma$$

and X>f(Y), it means that a small group of abnormally low analysis values that do not fall within the normal distribution group constituted by the analysis values of the great majority of analysis points, that is, a small group of points (analysis points) that have been locally contaminated, exists. Thus, Y can be determined from the value of X to obtain a combination of X and Y that satisfies the above combination.

On the other hand, when obtaining the analysis values by the first analysis method, when the analysis value Vp of the Pth point corresponding to a cumulative frequency of 2% is less than or equal to "Ave−3σ," and belongs to the same normal distribution group, although the probability f(3) of obtaining a value of "Avg−3σ" is less than 0.15%, the number of analysis points with excessively low analysis values will be excessively large, with at least 2% that exceed 0.15% existing. That is, there will exist analysis values that do not fall within the original normal distribution. In cases where the duration of a heat treatment is long and the temperature is high, and in cases where there is a large contact area with the metal jig, the expected area of localized contamination will increase. When the ratio of the total analysis region of the wafer surface accounted for by the area of the expected localized contamination reaches 3% or 4%, since X (=3 to 4) exceeds f(2)=2.5, Y=2 instead of Y=3, and Ave−2σ can be used as the threshold value.

In contrast, since the probability of a value of less than or equal to "Ave−2σ" is 2.5% within a single normally distribution group, even when the analysis value of the Pth point corresponding to a cumulative frequency of 2% is less than or equal to "Ave−2σ," from the perspective of probability theory, such an event can occur within a single group with a normal distribution, and one cannot say that localized contamination has occurred. Accordingly, when the cumulative frequency is X %, it is not appropriate to set the threshold value based on Y=2.

In an embodiment of the present invention, for example, it is possible to obtain a threshold value for determining the presence or absence of metal contamination following a heat treatment based on the cumulative frequency X %.

The example of adopting a normal distribution as the probability distribution function has been given above. However, in the method of evaluating metal contamination according to an aspect of the present invention, it is also possible to employ a Weibull distribution (Weibull plot) as the probability distribution function. When employing a Weibull distribution, the Weibull coefficient m=1 (random failure) can be employed as the threshold value. For example, when obtaining the analysis values based on the first analysis method, a threshold of m≤1 (initial failure or random failure) can be determined as the presence of localized metal contamination.

The semiconductor wafer that is evaluated by the method of evaluating metal contamination according to an aspect of the present invention can be a silicon wafer or the like that has been obtained by slicing to prescribed thickness a single crystal silicon ingot. Examples of heat treatments are various heat treatments such as processes that diffuse dopants, epitaxial growth, and $H_2$ annealing. Examples of the metal species that are to be evaluated are various types of metals that may negatively affect device characteristics, such as Fe, Ni, and Cu.

For example, in a semiconductor wafer manufacturing line in which the presence of localized metal contamination is determined by the method of evaluating metal contamination according to an aspect of the present invention, it is possible to prevent the occurrence of localized metal contamination in the semiconductor wafers that are subsequently manufactured on the same line by repairing or replacing equipment to reduce metal contamination. The method of evaluating metal contamination according to an aspect of the present invention can be used in this manner for process management. Further, the method of evaluating metal contamination according to an aspect of the present invention is also suitable for stably providing high-quality product wafers without localized metal contamination.

That is, a further aspect of the present invention relates to a method of manufacturing a semiconductor wafer, which is characterized by comprising preparing a wafer lot comprising a plurality of semiconductor wafers by a manufacturing process comprising a heat treatment; extracting at least one semiconductor wafer as an evaluation wafer from among the wafer lot; evaluating the evaluation wafer that has been extracted by the method of evaluating metal contamination described in the present invention; and shipping as a product wafer the semiconductor wafer comprised in the same lot as an evaluation wafer that has been determined as absence of localized metal contamination by the evaluation.

As set forth above, the method of evaluating metal contamination according to an aspect of the present invention permits precise evaluation of the presence or absence of localized metal contamination in semiconductor wafers such as silicon wafers following a heat treatment. Thus, this evaluation method makes it possible to provide with high reliability high-quality product wafers without localized metal contamination by shipping as product wafers the semiconductor wafers in the same lot as a semiconductor wafer that has been determined to be free of localized metal contamination following a heat treatment. The number of wafers in one lot and the number of wafers extracted can be suitably established.

EXAMPLES

The present invention will be described based on Examples below. However, the present invention is not limited to the embodiments shown in Examples.

Example 1

1. Lifetime Measurement

Four 200 mm φ silicon wafers (denoted as Nos. 1 to 4, hereinafter) were prepared. To strengthen the gettering function, minute BMDs had been formed in the wafers. Although this was within the range established by quality specifications, the BMD densities varied from wafer to wafer.

The wafers were heat treated for 90 minutes at 1,000° C. in an oxygen atmosphere. In the process, the wafers were divided into two groups. One group of wafers was placed on processing boats with a high contamination level and placed within a heat treatment furnace to form a localized low lifetime region spreading out from the starting point of the point of contact with the heat treatment boat in the vicinity of the perimeter of the wafer. The other group of wafers was heat treated using heat treatment boats with a low contamination level.

Following the heat treatment, each wafer was subjected to lifetime measurement by μ-PCD at 500 points in-plane at a pitch of 8 mm and a periphery exclusion width of 10 mm. FIG. 1(a) shows a lifetime map of the No. 1 wafer in the group with a high contamination level. FIG. 1(b) shows a lifetime map of the No. 3 wafer in the group with a low contamination level. A comparison of the two lifetime maps reveals localized metal contamination (a lifetime decrease) in the vicinity of the contact points (three points) with the processing boat in the wafer belonging to the group with a high contamination level.

2. Estimation of Number P

FIG. 2 shows a schematic drawing of the vicinity of one contact point between the processing boat and the silicon wafer in 1. above. With Ni and Fe as the metals being evaluated, from known values in the literature, the diffusion length of Ni in a heat treatment of 90 minutes at 1,000° C. is 7.6 mm, and the diffusion length of Fe is 4 mm. Based on the wafer size, measurement point size (8 mm×8 mm square), and these diffusion lengths of Ni and Fe, it can be expected that the heat treatment would cause diffusion of the contaminant metal elements to the three measurement points positioned in the vicinity of one point of contact with the processing boat. Since there were three contact points between the wafer and the processing boat, the number P of analysis points expected to be reached by diffusion due to heat treatment of the contaminant metal elements that were to be evaluated was 3×3=9.

3. Calculating the Threshold Value (The Lower Limit of the Normal Value Specified by the Probability Distribution Function)

In 2. above, since P=9 was estimated for a total number of 500 measurement points, the cumulative frequency X % calculates out to about 2%. Here, letting Y=3, one obtains f(Y)=0.15 and the relation X>f(Y) is satisfied. Letting Y=2, f(Y)=2.5, and the relation X>f(Y) is not satisfied. Thus, Y=3 is adopted.

The standard deviations and the average values of the lifetime values measured at the 500 points on the wafer surface of each of Nos. 1 to 4 were obtained, and the threshold values for evaluation of Y=3 in:

$$\text{Avg.} - Y^*\sigma$$

were calculated.

For each of wafer Nos. 1 to 4, the lifetime values measured at 500 points were arranged from smallest to largest in ascending order. When the 9th lifetime value was less than or equal to the threshold value that had been calculated, determination of localized metal contamination following a heat treatment was made, and when the threshold value was exceeded, determination of no localized metal contamination was made. Table 1 shows the determination results along with determination results obtained when the lifetime map was visually observed and determination of whether localized metal contamination was present was made based on whether a low lifetime region was present.

TABLE 1

| | | Lifetime (μs) | | | | | |
|---|---|---|---|---|---|---|---|
| | Sample No. | In-plane average (Avg.) | Standard deviation (1σ) | Lifetime value Vp at Pth point | Threshold value Avg.-3σ | Determination of localized contamination Results | Reference: Determination of localized contamination by visual observation of map Results |
| High contaminatioon level group | 1 | 426.8 | 37.2 | 308.2 | 315.3 | Presence of contamination | Presence of contamination |
| | 2 | 491.4 | 49.2 | 343.0 | 343.8 | Presence of contamination | Presence of contamination |
| Low contaminatioon level group | 3 | 429.4 | 37.0 | 323.1 | 318.5 | Absence of contamination | Absence of contamination |
| | 4 | 490.3 | 52.2 | 352.6 | 333.5 | Absence of contamination | Absence of contamination |

In the present Example, the points of contact with the processing boat, which was the contamination source, were positioned outside the lifetime measurement region. When the points of contact between the wafer and a contamination source such as a heat treatment boat, susceptor, or three-point support pins fall within the lifetime measurement region, the total number of measurement points coming into contact with the contamination source can be added to the total number of measurement points to which metal elements are expected to diffuse from the measurement points in contact with the contamination source and adopted as number P.

Further, microparticles of a material such as stainless steel alloy, which is a constituent material of various equipment, adhere to the wafer surface prior to and during the heat treatment process, sometimes causing localized metal contamination following a heat treatment. In this case, one can expect the metal element diffusing in disk-like fashion from points where the metal microparticles have adhered and estimate the measurement points reached by the metal contaminants to estimate number P.

As shown in Table 1, even within a single group, there was a large difference in lifetimes between wafers. This was due to the fact that internal BMDs were the dominant factor in lowering the lifetime, and there were considerable differences in BMD density between wafers.

When determining whether localized metal contamination was present in such a wafer group (with and without boat contamination) using the in-plane average value as an index, for example, when the lifetime average value of 429.4 μs of No. 3 was adopted as the threshold (lower limit) for no localized contamination, the No. 2 wafer of the high contamination level group ended up being determined to not have localized contamination. Conversely, when the lifetime average value of 491.4 μs of No. 2 was adopted as the threshold value (lower limit), the No. 3 wafer of the low contamination level group ended up being determined to have localized contamination.

In contrast, from the results given in Table 1, according to the present invention, it was confirmed possible to determine whether or not localized metal contamination was present following a heat treatment without being affected by differences in wafer BMD density.

Further, when the determination threshold is specified as a specific measured lifetime value, there is a risk of missing "weak and trace amounts" of "abnormalities." However, in the present invention, the determination of whether or not localized metal contamination is present is made based on "whether analysis values considered to be abnormal or heterogeneous were present when viewing the wafer surface as a whole," so evaluation could be conducted without missing weak and trace amounts of "abnormalities," that is, localized contamination.

Above-described Example 1 is an example of applying the first analysis method. An example of the application of the second analysis method will be given next as Example 2.

Example 2

1. Fe Contamination Level Determination by the SPV Method

Two 200 mm φ silicon wafers (denoted as samples 1 and 2 below) were prepared.

These wafers were subjected to a brief, high-temperature heat treatment for 10 minutes at 1,150° C. Subsequently, the Fe contamination level at 177 measurement points on each wafer was obtained from the diffusion length based on the SPV method.

Figure 3:
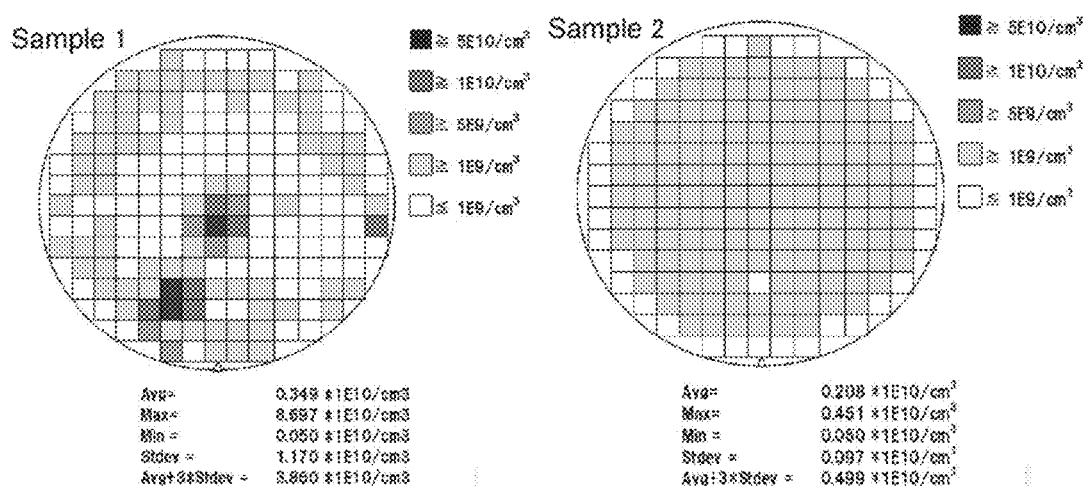
FIG. 3 Fe contamination concentration maps of two wafers measured by the SPV method in Example 2.

FIG. 3 shows the results obtained by Fe concentration map measurement by SPV for the wafers of samples 1 and 2. A look at the map of FIG. 3 reveals that localized Fe contamination was present in sample 1.

2. Estimation of Number P

Envisioning the case where fine dust containing Fe has adhered to the wafer prior to a heat treatment and Fe has diffused and spread horizontally with the dust as starting points during a heat treatment, the spreading will be in a circle with a radius of about 1 mm, which is the effective diffusion length of Fe over 10 minutes at 1,150° C.

Since SPV measurement in 1. above was conducted at a pitch of 13 mm, the size of a single measurement point was 13 mm×13 mm. Accordingly, the probability that the spreading of the above Fe contamination will remain within a single measurement point is high. Accordingly, in the present Example, the number P of analysis points where the diffusion due to the heat treatment of the contaminant metal element Fe that is to be evaluated is expected is estimated as P=1.

3. Calculating the Threshold Value (Upper Limit of the Normal Value Specified by the Probability Distribution Function)

A total of 177 measurement points were measured at a pitch of 13 mm in 1. above. Assuming the case where the threshold value was calculated as Y=2 in:

$$\text{Avg.} + Y*\sigma,$$

even for measurement points belonging to a single normal distribution group that have not been locally contaminated, the analysis values of 2.5% of the total, that is, an actual number of 4 or 5 measurement points, will be values greater than or equal to the threshold value of "Avg.+2σ." Thus, the above estimate that it will occur only at one measurement point is unsuitable for detecting the localized anomalies that have been estimated. Accordingly, when the analysis values of all of the analysis points have been arranged in ascending order, the determination criterion should be whether or not the Pth analysis value Vp counting over from the maximum value (in the present Example, the maximum value of the analysis values since P=1 as estimated in 2. above) is a value that is greater than or equal to the in-plane average value+3σ, that is, a value that is greater than or equal to the upper limit calculated as Y=3 in:

$$\text{Avg.} + Y*\sigma.$$

As shown in FIG. 3, in sample 1, the analysis value at the measurement point exhibiting the maximum value of Fe concentration is a value that is greater than or equal to the in-plane average value+3σ (Avg.+3σ), and determination is made that localized contamination starting at fine dust containing Fe is present. This determination result matches the determination results by visual observation of the map shown in FIG. 3.

On the other hand, in sample 2, the analysis value of the measurement point exhibiting the maximum value of Fe concentration falls below the in-plane average value+3σ (Avg.+3σ), which is the threshold. Thus, localized Fe contamination is determined not to be present. These determination results are also in line with the determination results based on visual observation of the map shown in FIG. 3.

For example, in cases such as when Fe contamination due to dust containing Fe diffuses over an extremely narrow region over a short period at elevated temperature as in Example 2, it is desirable to have Y=3σ to detect the metal contamination occurring over a small portion of the wafer. That is because although the probability of being greater than or equal to Avg+3σ when belonging to the same normal distribution is only 1.5/1,000, if the measurement value at just one point among the measurement points is greater than or equal to Avg+3σ, since it cannot be said to belong to the same group as the other measurement points, it can be viewed as an anomaly. Assuming there are several measurement points that are greater than or equal to Avg+3σ, it would mean that a certain amount of dust containing Fe had adhered. Even in such cases, based on the determination criterion of whether or not the maximum value of the measurement values was greater than or equal to "Ave+3σ," it would be possible to determine whether there was not a single measurement point exhibiting a localized and abnormal measurement value, that is, whether there was no localized contamination.

In contrast, assuming a case where "Avg.+2σ" was adopted as:

$$\text{Avg.} + Y*\sigma$$

as the upper limit of the average value specified based on a probability distribution function, the probability that even a measurement point contained in the same group as the normal distribution would be greater than or equal to Avg+2σ would be 2.5/100. Thus, 177 measurement points would include 4 or 5 points. Accordingly, when the analysis values of all of the analysis points were arranged in ascending order and the analysis value Vp of the Pth point counting over from the maximum value was greater than or equal to Avg+2σ, it would not mean that the Fe was abnormally high.

In contrast, in a case where the Fe contamination extended over a relatively broad range, multiple measurement points exhibiting abnormal values could exist. Thus, it would be suitable to adopt Y=2.

As set forth above, when adopting the normal value specified by the probability distribution function in the form of upper limit:

$$\text{Avg.} + Y*\sigma$$

as the upper limit determination criterion in the second analysis method, Y is desirably determined based on the range over which the contamination could spread and on the measurement pattern.

The present invention is useful in the field of manufacturing semiconductor substrates.

The invention claimed is:

1. A method of evaluating metal contamination in a semiconductor wafer that has been subjected to a heat treatment, which comprises:
    heating the semiconductor wafer;
    obtaining analysis values by analyzing a plurality of analysis points on a surface of the semiconductor wafer by a first analysis method or a second analysis method, wherein in the first analysis method, analysis values employed in evaluation decrease as an amount of contamination by a metal element that is to be evaluated increases, and in the second analysis method, analysis values employed in evaluation increase as an amount of contamination by a metal element that is to be evaluated increases; and
    among the plurality of analysis points, estimating a number P of analysis points to which a contaminant metal element that is to be evaluated and that has adhered to the semiconductor wafer due to contact with a contamination source is expected to diffuse due to the heat treatment; and wherein
    when the analysis values are obtained by the first analysis method, the analysis values of all of the analysis points are arranged in ascending order, and an analysis value Vp at a Pth point counting over from a minimal value is a value that is lower than or equal to a lower limit of a normal value specified by a probability distribution function, determination of presence of localized contamination by the metal element that is to be evaluated is made, and when the value exceeds the lower limit, determination of absence of localized contamination by the metal element that is to be evaluated is made; and
    when the analysis values are obtained by the second analysis method, the analysis values of all of the analysis points are arranged in ascending order, and an analysis value Vp of a Pth point counting over from a maximum value is a value that is greater than or equal to an upper limit of a normal value specified by a probability distribution function, determination of presence of localized contamination by the metal element that is to be evaluated is made, and when the value is lower than the upper limit, determination of absence of localized contamination by the metal element that is to be evaluated is made.

2. The method of evaluating metal contamination according to claim 1, wherein
    the probability distribution function is a normal distribution,
    the lower limit of the normal value specified by the probability distribution function in the case where the analysis values are obtained by the first analysis method is:

$$Avg.-Y*\sigma$$

wherein Avg. denotes an average value of the analysis values at all of the analysis points, σ denotes a standard deviation, and Y is a number ranging from 2 to 3, and the upper limit of the normal value specified by the probability distribution function in the case where the analysis values are obtained by the second analysis method is:

$$Avg.+Y*\sigma$$

wherein Avg. denotes an average value of the analysis values at all of the analysis points, σ denotes a standard deviation, and Y is a number ranging from 2 to 3.

3. The method of evaluating metal contamination according to claim 2, wherein
    a total number of the analysis points is denoted as $P_{all}$, the value of Y is determined based on a cumulative frequency X % as calculated by:

$$X=(P/P_{all})*100.$$

4. The method of evaluating metal contamination according to claim 1, wherein the analysis method that is used to obtain the analysis values is a μ-PCD method or an SPV method.

5. A method of manufacturing a semiconductor wafer, which comprises:
    preparing a wafer lot comprising a plurality of semiconductor wafers by a manufacturing process comprising a heat treatment;
    extracting at least one semiconductor wafer as an evaluation wafer from among the wafer lot;
    evaluating the evaluation wafer that has been extracted by a method of evaluating metal contamination; and
    shipping as a product wafer the semiconductor wafer comprised in the same lot as an evaluation wafer that has been determined as absence of localized metal contamination by the evaluation, wherein
    the method of evaluating metal contamination is a method of evaluating metal contamination in a semiconductor wafer that has been subjected to a heat treatment, which comprises:
    obtaining analysis values by analyzing a plurality of analysis points on a surface of the semiconductor wafer by a first analysis method or a second analysis method, wherein in the first analysis method, analysis values employed in evaluation decrease as an amount of contamination by a metal element that is to be evaluated increases, and in the second analysis method, analysis values employed in evaluation increase as an amount of contamination by a metal element that is to be evaluated increases; and
    among the plurality of analysis points, estimating a number P of analysis points to which a contaminant metal element that is to be evaluated and that has adhered to the semiconductor wafer due to contact with a contamination source is expected to diffuse due to the heat treatment; and wherein
    when the analysis values are obtained by the first analysis method, the analysis values of all of the analysis points are arranged in ascending order, and an analysis value Vp at a Pth point counting over from a minimal value is a value that is lower than or equal to a lower limit of a normal value specified by a probability distribution function, determination of presence of localized contamination by the metal element that is to be evaluated is made, and when the value exceeds the lower limit, determination of absence of localized contamination by the metal element that is to be evaluated is made; and
    when the analysis values are obtained by the second analysis method, the analysis values of all of the analysis points are arranged in ascending order, and an analysis value Vp of a Pth point counting over from a maximum value is a value that is greater than or equal to an upper limit of a normal value specified by a probability distribution function, determination of presence of localized contamination by the metal element that is to be evaluated is made, and when the value is lower than the upper limit, determination of absence of localized contamination by the metal element that is to be evaluated is made.

6. The method of manufacturing a semiconductor wafer according to claim 5, wherein the probability distribution function is a normal distribution, the lower limit of the normal value specified by the probability distribution function in the case where the analysis values are obtained by the first analysis method is:

$$Avg.-Y*\sigma$$

wherein Avg. denotes an average value of the analysis values at all of the analysis points, σ denotes a standard deviation, and Y is a number ranging from 2 to 3, and the upper limit of the normal value specified by the probability distribution function in the case where the analysis values are obtained by the second analysis method is:

$$Avg.+Y*\sigma$$

wherein Avg. denotes an average value of the analysis values at all of the analysis points, σ denotes a standard deviation, and Y is a number ranging from 2 to 3.

7. The method of manufacturing a semiconductor wafer according to claim 6, wherein a total number of the analysis points is denoted as $P_{all}$, the value of Y is determined based on a cumulative frequency X % as calculated by:

$$X=(P/P_{all})*100.$$

8. The method of manufacturing a semiconductor wafer according to claim 5, wherein the analysis method that is used to obtain the analysis values is a μ-PCD method or an SPV method.

* * * * *